United States Patent [19]
Frederiksen

[11] Patent Number: 5,400,297
[45] Date of Patent: Mar. 21, 1995

[54] METHOD AND A SYSTEM FOR TESTING CAPACITIVE, ACOUSTIC TRANSDUCERS

[75] Inventor: Erling Frederiksen, Holte, Denmark

[73] Assignee: A/S Bruel & Kjaer, Naerum, Denmark

[21] Appl. No.: 150,176

[22] Filed: Nov. 30, 1993

[30] Foreign Application Priority Data

May 31, 1991 [DK] Denmark ............... 1050/91

[51] Int. Cl.⁶ .................. H04R 29/00; G01R 27/26
[52] U.S. Cl. .................................................. 367/13
[58] Field of Search ..................... 367/13; 73/1 DV

[56] References Cited
U.S. PATENT DOCUMENTS

| | | | |
|---|---|---|---|
| 3,230,449 | 1/1966 | Kaiser | 324/98 |
| 4,648,078 | 3/1987 | Darton et al. | 367/13 |
| 4,648,079 | 3/1987 | Stedtnitz | 367/13 |
| 4,942,614 | 7/1990 | Hamilton | 367/13 |

*Primary Examiner*—Daniel T. Pihulic
*Attorney, Agent, or Firm*—Scully, Scott, Murphy & Presser

[57] ABSTRACT

A method and a system for testing one or more transducers, preferably acoustic transducers, from a central control unit. The transducers are individually connected to the inlet of a preamplifier (4) having a relatively high input resistance (6). A test conduit extends from the central control unit to each transducer. The test conduit communicates with the joint between the transducer and the inlet of the preamplifier (4) through a relatively small capacity (10). In this manner a method is obtained for testing the transducer, said testing being highly sensitive to the condition of the transducer and relatively insensitive to external fields.

10 Claims, 2 Drawing Sheets

METHOD AND A SYSTEM FOR TESTING CAPACITIVE, ACOUSTIC TRANSDUCERS

TECHNICAL FIELD

The invention relates to a method of testing one or more capacitive transducers, preferably acoustic transducers, from a central control unit, where the transducers are individually connected to an inlet of a preamplifier having a relatively high input resistance, and where a test conduit furthermore extends from the central control unit to the transducers, the testing of each transducer being performed by means of a test signal transmitted through the test conduit and a capacitor inserted in said test conduit to the joint between the transducer and the inlet of the preamplifier.

BACKGROUND ART

It is known to test one or more capacitive measuring microphones associated with preamplifiers and connecting wires, where each microphone is connected to the inlet of a preamplifier having a relatively high input resistance. The microphones may be placed far away from a central control unit performing the testing optimally automatically. A test signal is transmitted through an individual test conduit from the central control unit to each microphone. By this known method, the test conduit is connected to the chassis terminal of the microphone. The test signal is transmitted through the capacity of the microphone. Modern preamplifiers ensure that the response to the test signal is almost independent of the capacity of the microphone, and accordingly it is not possible to detect changes therein although said capacity has become extremely high or optionally shortcircuits.

Elder preamplifiers with a relatively high input capacity provide a slight sensitivity to changes in the capacity of the transducer. This sensitivity is, however, very small, typically of a magnitude smaller than the one achievable by the method according to the invention. In addition, external electromagnetic fields presents a technical problem, especially in connection with large measuring systems. The measuring system associated with the known central control unit is sensitive to external fields due to the separate chassis terminals of the microphone and the preamplifier.

U.S. Pat. No. 4,648,078 discloses a system for testing a plurality of acoustic transducers, a test signal being transmitted through the capacity between the screen and the inner conductor of a screened cable to the joint between the individual transducer and an amplifier. This system is, however, only able to indicate whether the amplifier and the cable to a central control unit is in order. The system is unable to indicate whether the capacity of the transducer has changed.

DESCRIPTION OF THE INVENTION

The object of the invention is to provide a method of the above type, which is highly sensitive to the condition of each transducer simultaneously with being relatively insensitive to external electromagnetic fields.

A method of the above type is according to the invention characterised by a relatively small capacity with a very high equivalent parallel resistance (leakage resistance) being inserted in the test conduit, and by the frequency characteristics measured by means of the test conduit being compared with previously determined characteristics so as to indicate errors, if any, in the transducer. The high equivalent parallel resistance (the leakage resistance) of the capacitor renders it possible to perform a testing even at the lowest operational frequencies in such a manner that it is possible to find the frequency characteristics and thereby to indicate errors, if any, in the transducer.

Moreover according to the invention the equivalent parallel resistance (leakage resistance) of the capacitor in the test conduit may be about $10^7 M\Omega$.

The capacitor in the test conduit may for instance be provided by means of a substrate with a soldering layer on one side and a conducting path on the opposite side. The resulting capacitor is provided with a very high parallel resistance (parasite resistance). As a result it is also possible to perform tests at the lowest operational frequencies.

The invention relates furthermore to a system for carrying out the method of testing one or more transducers, preferably capacitive transducers, from a central control unit, where the transducers are individually connected to an inlet of a preamplifier having a relatively high input resistance, and where a test conduit from the central control unit is connected to each of the transducers. The system is characterised by the test conduit being connected to the joint between the transducer and the inlet of the preamplifier through a relatively small capacitor with a very high equivalent parallel resistance (leakage resistance), whereby a particularly advantageous system is obtained for the control of the transducers.

In addition according to the invention, the test conduit may communicate with a change-over switch in the central control unit, said change-over switch being connected either to a chassis or to a test AC voltage.

Moreover according to the invention, the capacitor in the test conduit may be an adjustable screw in a capsule, said adjustable screw being electrically insulated from the remaining portion of the capsule.

Finally according to the invention, the capacitor in the test conduit may be an adjustable screw in an adapter in form of a separate unit between the capsule and the preamplifier. Such a unit can be delivered separately together with the necessary supply lines.

BRIEF DESCRIPTION OF THE DRAWINGS

The invention is described in greater detail below with reference to the accompanying drawings, in which.

BEST MODE FOR CARRYING OUT THE INVENTION

The invention relates to a method of testing transducers, such as microphones, which can be arranged far from a central control unit. At airports, a demand exists for instance for a possibility of continuously measuring and registering the aircraft noise. The most noisy aircrafts are sometimes penalized by fewer landing permits or optionally fined. Accordingly, it is necessary to use a comprehensive measuring system involving a high number of microphone units for the registration of the noise. In order to ensure that all the microphones of such a measuring system are in order, it is necessary at regular intervals to test said microphones. The reliability of the accuracy of the measuring system is of decisive importance because an exceeding of the allowed noise limits can have very serious consequences.

Figure 1:
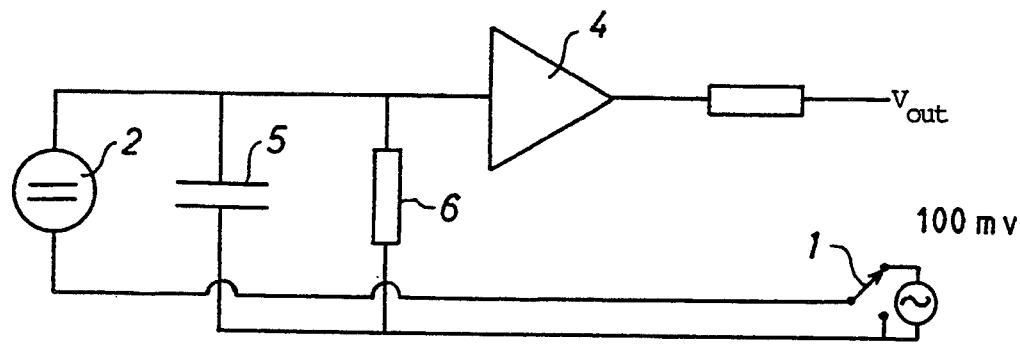
FIG. 1 illustrates a known capacitor microphone with an associated preamplifier circuit.

FIG. 1 illustrates a known microphone unit comprising a capacitor microphone 2 and a preamplifier 4. The value of the capacitor 5 corresponds to the input capacity of the preamplifier 4 plus the capacitor of the supply line. The input resistance 6 corresponds to the input resistance of the preamplifier 4. The capacitor 5 and the resistance 6 are typically of a value of 0.2 pF and $5 \cdot 10^{10}$ Ω. The capacity of the microphone 2 is approximately 20 pF. A test conduit 8 is connected to one input terminal of the microphone 2, whereby a test signal of for instance 100 mV can be transmitted at one or more discrete frequencies through the test conduit 8 and a change-over switch 1 in the central control unit.

Figure 2:
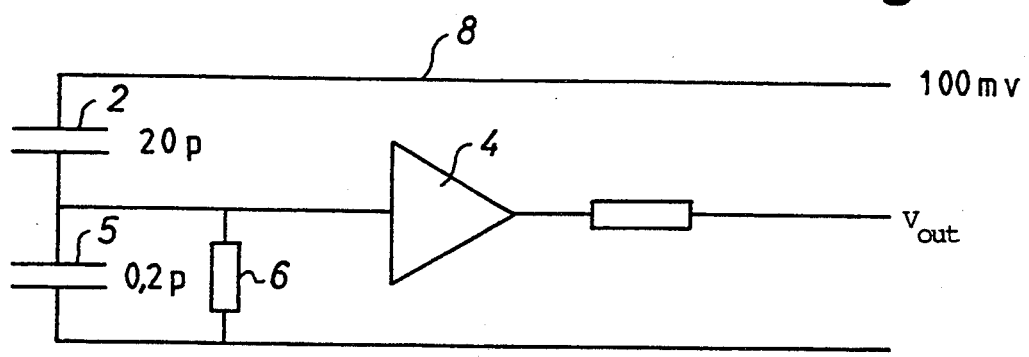
FIG. 2 illustrates a corresponding equivalent circuit.
Figure 3:
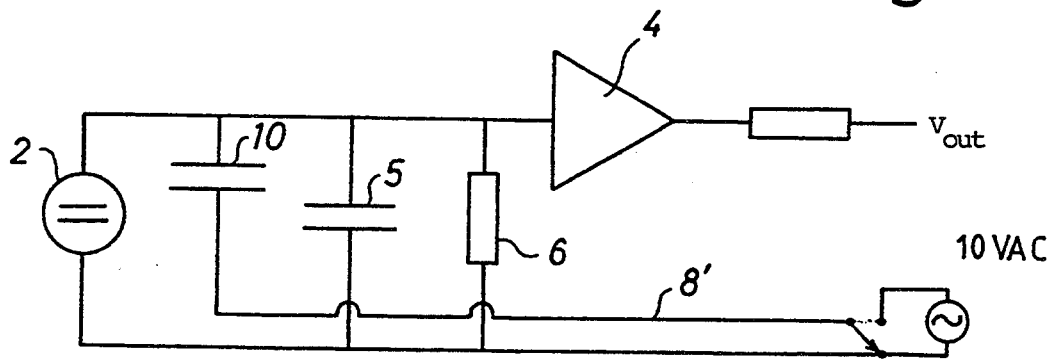
FIG. 3 illustrates a capacitor microphone circuit with a test conduit according to the invention.
Figure 4:
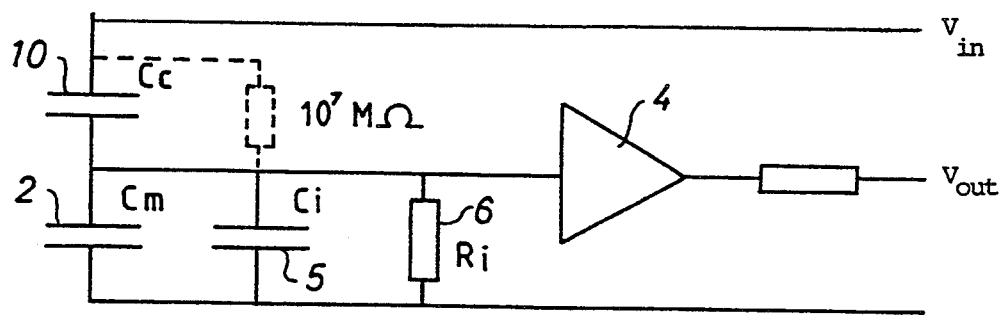
FIG. 4 illustrates a corresponding equivalent circuit.

FIG. 2 illustrates the corresponding equivalent circuit in which the change-over switch 1 is arranged in the position shown in FIG. 1. It appears, that a shortcircuiting of the capacitor microphone 2 ($C_m = \infty$) results in nothing but a minor change of the output signal $V_{out}$ of the preamplifier 4 unlike the system according to the invention. The system according to the invention is so sensitive that even minor changes of 1% can be detected. Minor changes can for instance be caused by the parts of the microphone 2 being warped relative to one another, or by the membrane in the microphone being slackened to such a degree that it is pulled towards a backplate electrode of an electrical polarisation voltage between the membrane and the backplate electrode. The change caused by a shortcircuiting ($C_m = \infty$) in the known system is so insignificant that it can hardly be measured, cf. the formula $$V_{out}/V_{in} - [C_m/(C_m + C_i)]A$$

where
$C_m$ is the capacity of the microphone,
$C_i$ is the input capacity of the preamplifier, and
A is the amplification of the preamplifier.

In connection with tube amplifiers, the input capacity is typically 3 pF, whereas the amplification is typically 0.95. A typical ½" microphone of 20 pF results in the following voltage ratios.

$$V_{out}/V_{in} - 20/(20+3) \cdot 0.95 = 0.83$$

A broken membrane or a drop of water in the microphone can cause substantial measuring errors by shortcircuiting the capacity of the microphone. Such serious errors can be detected by the central unit because the voltage ratio changes from 0.83 to 0.95. The system is, however, rather insensitive to changes in the capacity and insignificant changes cannot be detected.

The system according to the invention involves such a proportional relationship that a change in capacity of for instance 5% results in a change in the output signal $V_{out}$ of 5%.

The known capacitor microphone requires an insulation between the capsule and the remaining portion of the microphone including the preamplifier 4 as these portions must be mutually insulated during the transmission of the test signal. The change-over switch 1 in the central control unit connects the capacitor microphone 2 either to a test voltage of about 100 mV or to the chassis. The connecting to the chassis through the change-over switch 1 in the central control unit is thereby performed through a relatively long conducting path implying that irrelevant signals can be picked up.

The test conduit 8' includes a relatively small capacitor 10 connected to the joint between the capacitor microphone 2 and the input of the preamplifier 4. The capacitor 10 is of a magnitude of about 0.1 pF, i.e. of the same magnitude as the capacity 5. As a result a highly significant change is obtained in the output signal $V_{out}$ of the preamplifier 4 in case the capacitor microphone 2 shortcircuits, and even small changes in the capacity of about 1% can be detected. The parallel resistance (the leakage resistance) of the capacitor 10 must, however, be of the magnitude $10^7$M Ω in order to allow the leakage current to be about 100 times smaller than the capacity current of the capacitor 10, as an unacceptable frequency nonlinearity is otherwise found in the lower portion of the frequency range. As a consequence of the latter, a parallel resistance (leakage resistance) must apply which is of the magnitude $10^7$M Ω in order to test a typical capacitor microphone system at a low cut-off frequency of for instance 20 Hz.

Figure 5:
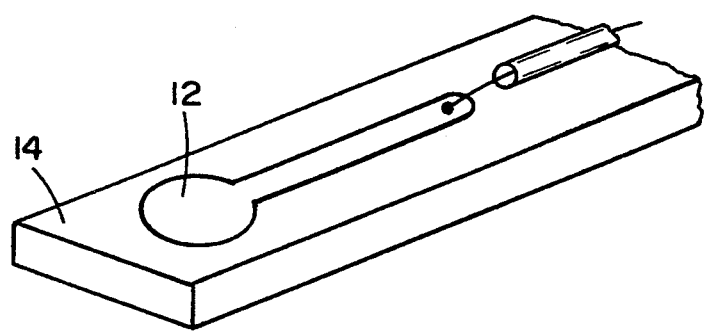
FIG. 5 illustrates a portion of the test conduit according to the invention.

Such a small capacitor 10 with a high leakage resistance is according to the invention provided by means of a substrate 14, cf. FIG. 5, provided with a soldering layer 12 on one side and a conducting path (not shown) on the opposite side. The leakage currents are thereby very small with the result that the capacity is very low and can be trimmed by cutting off portions of the soldering layer 12 by means of a laser beam or other abrasive means. The substrate can for instance be formed by the circuit card provided with the preamplifier 4.

As a result, a defect capacitor microphone 2 causes a remarkable change in the output signal from the preamplifier 4 when a test signal of the magnitude 10 V is transmitted to the test conduit 8'. The output voltage is $$V_{out} = V_{in} \cdot C_c/(C_m + C_i + C_c) \cdot A$$

or $$V_{out} = Q_{in}/(C_m + C_i + C_c) \cdot A$$

or $$V_{out} = Q_{in}/(C_m + C_i) \cdot A$$

as $$C_c << C_m + C_i$$

where
$C_c$ is the capacity, through which the test signal is transmitted,
A is the amplification, and
$Q_{in}$ is the input charge.

When it is assumed that
$V_{in} = 10$ V; $C_c = 0.1$ pF; $C_m = 20$ pF; $C_i = 0.2$ pF; and $A = 0.995$, the result is $$V_{out}/V_{in} = \frac{0.1}{20 + 0.2 + 0.1} \cdot 0.995 = 4.9 \cdot 10^{-3} \text{ corresponding}$$

to $V_{out}=49$ mV at a test signal of 10 V.

If $C_m$ is changed to $\infty$ corresponding to a shortcircuiting, $V_{out}$ is almost o. A testing at several different frequencies can reveal whether the frequency characteristic has been changed relative to earlier measured characteristics, and the source of error can be evaluated.

It is, however, very important that the leakage resistance is very high, in practise of the magnitude $10^7$M $\Omega$. The stability of the capacity must typically be so good that neither the temperature nor the time results in changes exceeding 1%.

The capacity is typically 100 times smaller than the capacity of the microphone, i.e. 0.1 pF or lower.

Figure 6:
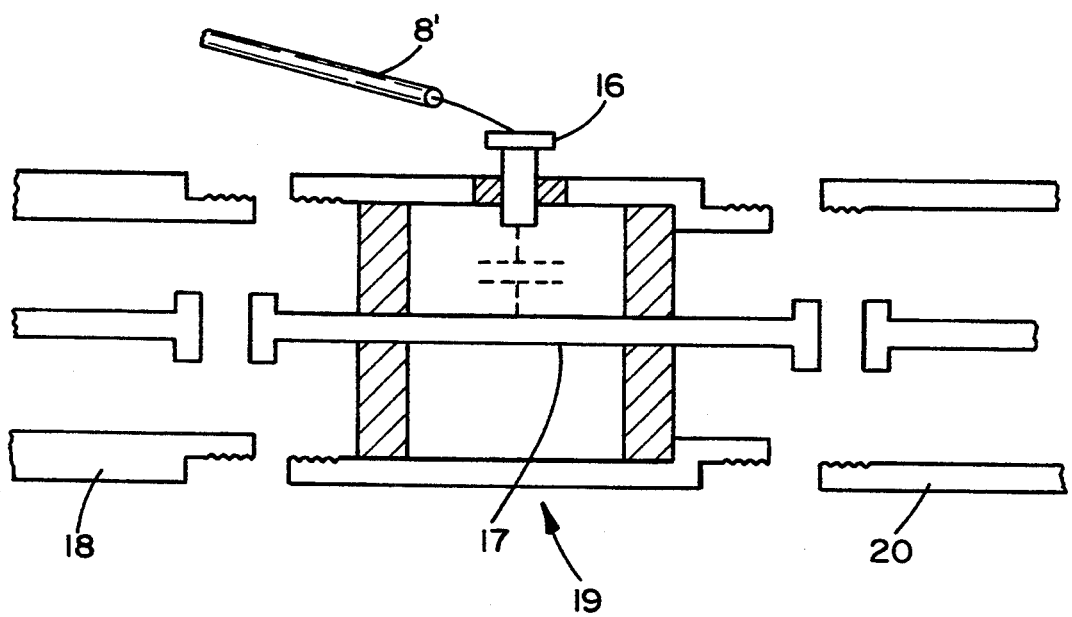
FIG. 6 illustrates an adapter insertable between the preamplifier and the capsule and in which an adjustable metal screw is provided, said screw being electrically insulated from the remaining portion of the capsule.

The relatively small capacitor in the test conduit 8' can alternatively be provided in form of an adjustable screw 16 in the microphone capsule 20 or in an adapter 19 between the capsule 20 and the preamplifier, said screw 16 being electrically insulated from the remaining portion of the capsule or the adapter. The adjustable screw 16 possesses a low capacity relative to a permanently supported conduit 17 providing the connection between the capacitor microphone and the preamplifier, cf. FIG. 6. The test conduit 8' is connected to the screw 16. The only important feature is that the capacity is very stable. The exact value of the capacity need not necessarily be known provided it is stable.

Figure 7:
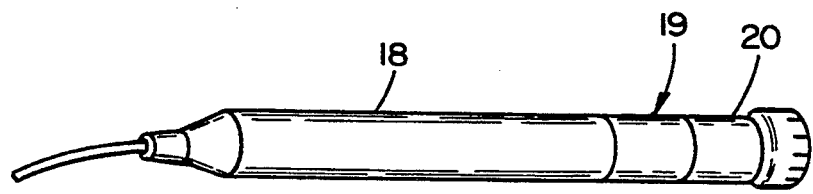
FIG. 7 illustrates the entire microphone unit.

FIG. 7 illustrates the entire microphone unit comprising the encapsulated preamplifier 18, the adapter 19, and the microphone capsule 20.

Based on the frequency characteristics of the ratio of the output voltage $V_{out}$ to the input voltage $V_{in}$ it is furthermore possible to detect errors, if any, and to decide whether the capacitor microphone 2 should be replaced. The latter is very advantageous in practise in connection with a large number of microphones far away from a central control unit.

The method according to the invention can also be used in connection with other capacitive transducers, such as piezoelectric hydrophones and accelerometers, and it can for instance be used for controlling whether an accelerometer has been correctly mounted.

The system according to the invention is furthermore rather insensitive to external electromagnetic fields, such as radar fields adjacent an airport, because the conductor path from the chassis terminal of the microphone to the chassis terminal of the preamplifier is very short. In other words, a very efficient chassis connection is obtained.

Other sources of errors beyond water drops in the microphone and shortcircuiting of the capacitor microphone are for instance an incorrect electrostatic charge. An incorrect electrostatic charge may apply to the membrane of the capacitor microphone. An incorrect charge results in a changed capacity of the capacitor microphone. Even small errors in the microphone or small changes in the tightening or tensioning of the membrane can be detected by means of the system according to the invention.

The important factor is that the measuring accuracy is known, and furthermore that said accuracy does not change gradually. Only then it is possible to determine the fines relating to an exceeding of the allowed noise level.

The conductor from the transducer and each preamplifier to the central unit are also tested.

I claim:

1. A method for remotely testing one or more capacitive acoustic transducers from a central control unit, comprising individually connecting each capacitive acoustic transducer to an inlet of a preamplifier (4) having a relatively high input resistance (6), placing a test conduit (8') extending from the central control unit to each capacitive acoustic transducer, testing each individual capacitive acoustic transducer by transmitting a test signal through the test conduit (8') and a capacitor (10), having a small capacitance relative to the capacitance of the capacitive acoustic transducer, inserted in said test conduit (8') at the connection between the capacitive acoustic transducer and the inlet of the preamplifier (4), characterized by selecting the capacitor (10) inserted in the test conduit (8') to have an equivalent parallel resistance (leakage resistance) which is large compared to the impedance of the capacitor (10), measuring the frequency characteristic via the test conduit (8'), and comparing the measured frequency characteristic with previously determined frequency characteristics so as to indicate errors, if any, in the transducer.

2. A method as claimed in claim 1, characterized by selecting the capacitor (10) in the test conduit (8') to have a value of approximately 0.1 pF.

3. A method as claimed in claim 2, characterized by selecting the equivalent parallel resistance (leakage resistance) of the capacitor (10) in the test conduit (8') to be about $10^7$M $\Omega$.

4. A method as claimed in claim 1 or 2 or 3, characterized by providing the capacitor (10) in the test conduit (8') by a substrate (14) with a soldering layer (12) on one side and a conducting path on the opposite side (FIG. 5).

5. A method as claimed in claim 4, characterized by trimming the soldering layer (12) by a laser beam or other abrasive means until the desired capacitance of the capacitor (10) is obtained.

6. A system for remotely testing one or more capacitive acoustic transducers from a central control unit, wherein each capacitive acoustic transducer is individually connected to an inlet of a preamplifier (4) having a relatively high input resistance (6), and a test conduit (8') extends from the central control unit to each of the capacitive acoustic transducers, with the testing of each individual capacitive acoustic transducer being performed by means for a transmitting a test signal through the test conduit (8') and a capacitor, which has a small capacitance compared to the capacitance of the transducer, inserted in said test conduit (8') at the connection between the transducer and the inlet of the preamplifier (4), characterized in that the capacitor (10) inserted in the test conduit (8') has an equivalent parallel resistance (leakage resistance) which is large compared to the impedance of the capacitor (10), and that the frequency characteristic is measured via the test conduit (8') and compared with previously determined frequency characteristics so as to indicate errors, if any, in the transducer.

7. A system as claimed in claim 6, characterized by the capacitor (10) in the test conduit (8') having a value of approximately 0.1 pF.

8. A system as claimed in claim 6, characterized by the equivalent parallel resistance of the capacitor (10) being of the magnitude $10^7$M $\Omega$.

9. A system as claimed in claim 6 or 7 or 8, characterized by the capacitor in the test conduit (8') including an adjustable screw in a capsule (20), said adjustable screw being electrically insulated from the remaining portion of the capsule.

10. A system as claimed in claim 6 or 7 or 8, characterized by the capacitor in the test conduit (8') including an adjustable screw (16) in an adapter (19) in a separate unit between the capsule (20) and the preamplifier (18).

* * * * *